United States Patent [19]
Birge

[11] Patent Number: 5,559,732
[45] Date of Patent: Sep. 24, 1996

[54] BRANCHED PHOTOCYCLE OPTICAL MEMORY DEVICE

[75] Inventor: Robert R. Birge, Onodaga County, N.Y.

[73] Assignee: Syracuse University, Syracuse, N.Y.

[21] Appl. No.: 364,138

[22] Filed: Dec. 27, 1994

[51] Int. Cl.[6] .................................................. G11C 13/00
[52] U.S. Cl. ............................................ 365/120; 365/112
[58] Field of Search ......................................... 365/215, 235, 365/234, 106, 120, 112

[56] References Cited

U.S. PATENT DOCUMENTS

| | | | |
|---|---|---|---|
| 3,480,918 | 11/1969 | Benson | 340/173 |
| 3,518,634 | 6/1970 | Ballman et al. | 340/173 LM |
| 3,851,318 | 11/1974 | Taylor et al. | 340/173 LS |
| 3,902,175 | 8/1975 | Winzer | 343/17.1 R |
| 4,078,229 | 3/1978 | Swanson et al. | 340/173 |
| 4,434,477 | 2/1984 | Sander et al. | 365/120 |
| 4,471,470 | 9/1984 | Swainson et al. | 365/127 |
| 4,479,199 | 10/1984 | Friedlander et al. | 365/121 |
| 4,633,445 | 12/1986 | Sprague | 365/234 |
| 4,713,795 | 12/1987 | Woike et al. | 365/119 |
| 4,789,965 | 12/1988 | Michl et al. | 365/121 |
| 5,124,944 | 6/1992 | Suzuki et al. | 365/113 |
| 5,162,819 | 11/1992 | Sakai et al. | 346/153.1 |
| 5,223,355 | 6/1993 | Hampp et al. | 430/1 |
| 5,253,198 | 10/1993 | Birge et al. | 365/106 |
| 5,268,862 | 12/1993 | Rentzepis | 365/151 |
| 5,283,777 | 2/1994 | Tanno et al. | 369/108 |
| 5,289,407 | 2/1994 | Strickler et al. | 365/106 |
| 5,353,247 | 10/1994 | Faris | 363/108 |

*Primary Examiner*—A. Zarabian
*Attorney, Agent, or Firm*—Trapani & Molldrem

[57] ABSTRACT

A high density volmetric optical memory stores information in three dimensions by selectively activating a photochemical branching reaction from a short-lived thermal intermediate of the primary photocycle of a light-transducing protein storage medium. A paging laser actuates a selected planar sheet or page of the medium at one wavelength, and data lasers send selected data beams at another wavelength orthogonal to the selected page. In a preferred mode, the medium is bacteriorhodopsin, and the paging beam raises the photocycle from the ground or resting state bR to an intermediate O, and the data beams interact with the O intermediate to create branch species P and Q. The data beams do not interract strongly with bR or with the P or Q. A differential read operation can employ the same paging and data wavelengths. Preferably a partial conversion only is required, with [95% bR, 5% P+Q] representing "0" and [90% bR, 10% P+Q] representing "1".

10 Claims, 6 Drawing Sheets

PARALLEL WRITE SEQUENCE

PARALLEL READ SEQUENCE

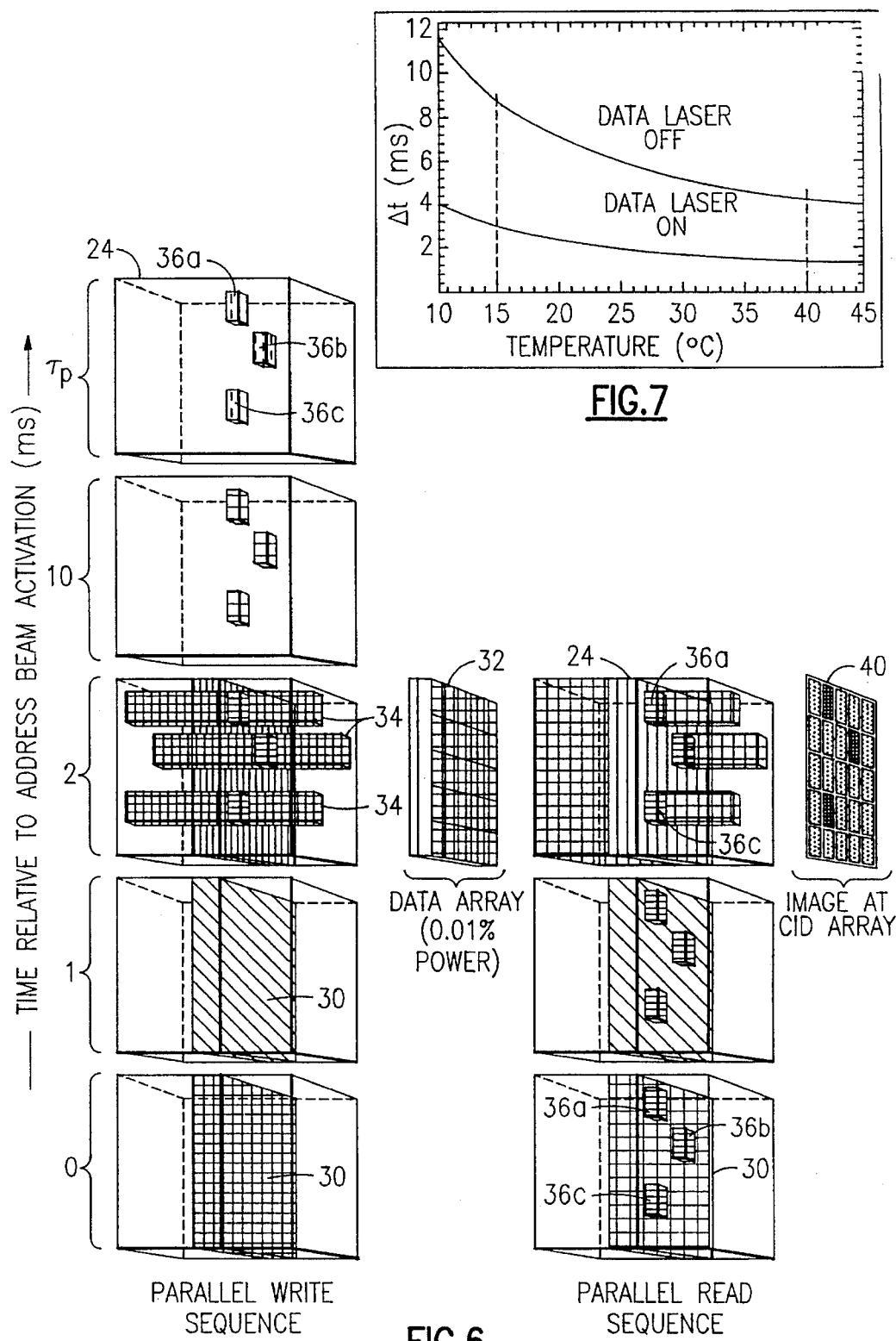

BRANCHED PHOTOCYCLE OPTICAL MEMORY DEVICE

This invention was developed under work in connection with the following grants: U.S. Air Force—Rome Laboratories Grant No. F3 0602-93-C-0059; and National Institutes of Health Grant No. GM34548. The government may have certain rights in the invention.

BACKGROUND OF THE INVENTION

The present invention relates to high density random access data storage, and is more especially directed to an optical memory system in which laser light is employed to write and read data via a single-photon process in a confined volume. A key feature of the invention is the use of a photosensitive substance that changes among several states when irradiated with light of known wavelengths. One example of such a substance is a light-sensitive protein called bacteriorhodopsin. This protein is capable of changing in its light absorbing and transmitting properties by illuminating it with certain specific wavelengths of visible light. The protein is also capable of emitting an electric signal indicative of the binary state of an irradiated cell of the confined volume.

A number of attempts have been made to produce optical memories that employ a nonlinear optical process. U.S. Pat. No. 4,485,345 describes a two-photon process within an irradiated volume that exposes a sensitized medium. The medium is a four-level material, and the two-photon process generates a microscopic interference pattern. The gating property of the two-photon photochemistry provides for nondestructive reading. Patterns can be produced at several depths below the surface, and thus a three-dimensional capability is possible. A key feature of the branched-photocycle memory is the use of linear, rather than non-linear, optical activation. The advantages are explored below.

Another two-photon, three-dimensional memory has been proposed based on the use of two distinct photochemical forms of spirobenzopyran. In this approach the storage medium is an unoriented organic chromophore in a polymer matrix. The writing process involves a two-photon induced photochemical change involving heterolytic cleavage, the read process is based on the observation of fluorescence from the merocyanine form, and there are blurring effects from the two-photon induced photochemistry that occurs in adjacent bit cells outside of the irradiated volume. One version of this type of memory device is discussed in U.S. Pat. No. 5,268,862.

Another storage device that employs a volume of field-oriented bacteriorhodopsin in a polymer medium and contained in a mechanically displaceable vessel is described in U.S. Pat. No. 5,253,198 to Robert R. Birge and Deshan S. K. Govender. This memory device involves two lasers oriented along respective orthogonal axes that intersect within the volume. Both lasers are pulsed on for writing at a bit cell, and then a photochemical process cleaning is carried out by actuating the two lasers non-simultaneously. The read cycle involves actuating two lasers, and then discriminating the "1" or "0" state of the interrogated bit cell from the electric signal generated by the medium. This process does have some disadvantages in that it requires mechanical displacement of the volume relative to the read/write lasers, and in that the writing process will inevitably create some conversion of the bacteriorhodopsin in adjacent bit cells.

A number of other U.S. Patents concern themselves with the general field of optical memories, and of these several involve two-photon writing or reading.

U.S. Pat. No. 5,124,944 relates to an optical storage device with a matrix that contains "guest" molecules that serve as electron donors or electron acceptors. The medium stores two bits of data that are separated in the frequency domain. The method of storage involves creating "holes" in the absorption band to correspond to the frequencies of the particular fight components.

U.S. Pat. No. 3,480,918 concerns a three-dimensional optical memory, but employs a light-excitable impurity semiconductor.

U.S. Pat. No. 4,078,229 concerns a three-dimensional optical memory with a two-photon system of intersecting beams. This can employ certain specific media, such as diphenylcyclopentadiene $Cr(CO)_6$ dissolved in methylmethacrylate containing azoisobutyronitrile, and barium acrylate dissolved in gelatin containing p-toluenesulphinic acid.

U.S. Pat. No. 4,479,199 concerns a photon echo optical memory system where an echo cell contains a medium that has at least one photo-excited state.

U.S. Pat. No. 5,223,355 relates to a holography system that uses a bacteriorhodopsin-based medium and in which circularly polarized light is used to record a hologram while linearly polarized light is used to reconstruct the hologram.

U.S. Pat. No. 5,283,777 relates to a two-photon, three-dimensional optic recording medium, and a technique that employs photopolymerization.

U.S. Pat. No. 5,289,407 concerns an optical memory device, such as a write-once, read-many-times memory (WORM), configured as a two-photon, three-dimensional memory. The optical film in the device has several distinct bit planes.

During the past decade, the speed of computer processors has increased between two and three orders of magnitude (i.e., a factor of between a hundred and a thousand), with the largest increase occurring in small desktop workstations. This dramatic increase in processor capability has been unmatched by any corresponding increase in data storage densities, which have increased only by one order of magnitude both in random access memory and in sequential (hard disk) memory technology. Meanwhile, the computer arts have entered an era where a majority of computational algorithms are limited less by computer speed than by on-line data storage capacity, and the cost of a typical scientific workstation is determined in large part by the costs of random access memory (RAM) and disk storage capacity. As the computer arts move into the future, it is clear that the costs of computer system are becoming more and more memory driven, and this trend will continue until a new memory architecture evolves.

One new architecture that has received some attention during recent years is a technique that employs a two-photon absorption process to store data in three dimensions. Memories based on this architecture read and write information by using orthogonal laser beams to address an irradiated cell, on the order of 200 $\mu m^3$, within a much larger volume of a nonlinear photochromic material. A two-photon process is used to initiate the photochemistry, and this process involves the unususal capability of some molecules to capture two photons simultaneously to populate an energy level within the molecule with an energy equal to the sum of the energies of the two photons that are absorbed. Because the probability of two-photon absorption process scales as the square of the intensity, photochemical activation is limited to a first approximation to regions within the irradiated volume. Unfortunately, photochemistry outside of the irradiated volume cannot be eliminated entirely, and this leads to ensuing problems.

The three-dimensional addressing capability derives from the ability to adjust the location of the irradiated volume in three dimensions. Two dimensional optical memories have a storage capacity that is limited to $1/\lambda^2$, where $\lambda$ is the wavelength employed, which yields approximately $10^8$ bits/$cm^2$. In contrast, three-dimensional memories can approach storage densities of $1/\lambda^3$, which yields densities of approximately $10^{12}$ bits/$cm^3$. In principle, a two-photon three-dimensional memory can store roughly three orders of magnitude more information in the same size enclosure relative to a two-dimensional optical disk memory. In practice, optical limitations and issues of reliability lower the above ratio to values closer to 100. Nevertheless, the two-photon approach makes parallel addressing of data possible, which enhances data read/write speeds and system bandwidth.

Although two-photon volumetric memories offer the significant storage density advantages outlined above, there are disadvantages that prompted the development of the optical architecture as it has evolved to this point. First, a two-photon process can only be initiated under conditions of high photon flux. Although the use of sharp focussing and molecules with large two-photon absorptivities makes the two-photon technique viable, the flux requirements remain significant. While these high flux requirements do not absolutely preclude commercialization, the cost of generating high light flux intensities represents a potential barrier to commercialization. Of equal importance is the tendency of all two-photon architectures to generate unwanted photochemistry outside the targeted irradiated cell or volume. In one approach, cleaning pulses are required for resetting the memory cells outside of the irradiated volume. An alternative is to select wavelengths and intensities that independently have a low probability of initiating two-photon processes. This technique been discussed in D. A. Parthenopoulos and P. M. Rentzepis, 245 *Science* 843–845 (1989). The intensities of the two beams are adjusted so that the laser with a wavelength with a higher probability of inducing two-photon intensity is the more intense beam. The combination of these two characteristics dramatically decreases the amount of photochemistry outside the irradiated volume. Unfortunately, this technique does not eliminate spurious photochemistry, and a large number of read/write operations can still lead to loss of data integrity. Materials with narrow absorption bands work best with single wavelength photochemical cleaning. Regardless of this, virtually all two-photon volumetric schemes require some refresh or cleaning methods to preserve data integrity.

One remaining two-photon approach is worth a few words of discussion, because of its potential to eliminate the need for cleaning pulses or refresh methods. The architecture for this approach is based on the use of independently-phased or binary-phased laser arrays. The independently-phased array architecture is based on the use of linear or rectangular arrays of diode lasers which can be independently phased by external control. A single location is addressed by adjusting the phase of each of the coherent light sources (lasers) so that at the desired "focus" point, the phases of the individual light sources are identical, i.e., "in phase". The constructive interference point is considered descriptively as the "focus" point. That is, the light is phased, rather than actually focussed, to generate constructive interference at a specific location, and to create destructive interference everywhere else. If a sufficient number of coherent fight sources are present, and their geometry is correctly chosen, locations outside of the irradiated volume will be "irradiated" by light of random (i.e., destructive) phase and no excitation will take place. A single linear array of 200 phased laser diodes can achieve near diffraction-limited performance. In practice, it is not possible to phase lasers perfectly, and simulations including phasing errors suggest that actual devices will require two orthogonal linear arrays each with 256 elements. Alternatively, one can use fixed phase lasers and selectively turn on only those lasers that are properly phased relative to the position of the irradiated volume. This architecture is referred to as a binary phased array, or simply a binary array, and while it requires typically four times as many lasers to accomplish diffraction-limited performance, it is more easily implemented in both hardware and software. Both types of devices are currently under investigation in laboratories in North America, Europe, and Japan. Successful implementation of large scale optical arrays has not yet been demonstrated, and so the commercial viability of this architecture is rather uncertain. Therefore, it is of utmost importance to investigate architectures that resolve the problem of unwanted photochemistry without relying on optical addressing architectures such as phased arrays, which are high-risk and expensive to implement. Accordingly, the techniques that are considered should optimally be implemented either with or without phased arrays, and potentially with either one-photon or two-photon architectures.

OBJECTS AND SUMMARY OF THE INVENTION

It is an object of this invention to produce a three-dimensional data storage memory system that has the attributes of high capacity, high speed, and high data integrity.

It is a more specific object to provide a branched-photocycle architecture for a memory device which solves the problems of the prior art, and which avoids unwanted photochemistry in the data cells outside of the addressed data cells.

It is a further object of the invention to create a memory device that can be implemented using branched-photocycle volumetric architecture, with a photochromic substance that maintains its "1" or "0" state stably for long periods.

It is a still further object of the invention to provide a memory device that can be implemented with available photoemitting elements and available photodetecting elements.

In accordance with an aspect of this invention, a branched photocycle volumetric optical memory device employs a volume of a photooptical material that has a stable ground resting state and a plurality of optically excited states including a stable excited state and an metastable state. The volume is configured as a succession of planar pages, with each page being configured as an orthogonal array of data cells. A paging arrangement illuminates a selected page of the volume at a time, but not the remaining, non-selected pages, at a first or paging wavelength to transfer the photooptical medium within the selected page from its resting state to its metastable state. A data selection array is then actuated for illuminating one or more selected data cells within the selected page, but not non-selected cells in the page, at a second wavelength to convert the material within the selected cell or cells from the metastable state to a stable branched state. The material in the non-selected cells then returns to the resting state. The stable branched state represents one binary condition, e.g. "1", while the resting state represents the complementary binary condition, e.g., "0". An optical read cycle reads the binary condition of each of the data cells of a selected page of the volume. With this architecture, an entire page of data can be written in and read out in parallel, which facilitates achieving the desired data speed.

A basic requirement for the implementation of all branched photocycle volumetric memories is the availability of a molecule or light-transducing protein which undergoes a photocycle upon light activation, and which has one or more thermal intermediates within the photocycle which can be photochemically converted into a stable species. Orthogonal light beams then activate the branched photocycle only at that cell within the volumetric memory where the two beams cross, and the timing between the light beams is appropriate. The branched-photocycle volumetric architecture can, in principle, be implemented using a variety of different molecules and light-transducing proteins, but each photochromic system will have its own unique characteristics. Therefore it is useful to describe the architecture with reference to a specific photoactive memory medium. Our current implementation is based on the use of the protein bacteriorhodopsin. This protein has been implemented in earlier memory devices, including the volumetric two-photon memory described in U.S. Pat. No. 5,253,198. Background information about the origins and photochemical properties of bacteriorhodopsin will be described in detail below. In short, the photocycle of bacteriorhodopsin involves paging the material using a paging wavelength (680 nm) to transfer the protein from its resting state bR to an intermediate or metastable state O. Then a write wavelength (600 nm) transfers the bacteriorhodopsin from the O state to a long-lived excited state Q. Reading data can be carded out by paging, as in writing; that is, irradiating a selected page of the volume of bacteriorhodopsin with the paging wavelength, and then illuminating each of the data cells in the page with the write wavelength, but at a much lower strength than is used for writing. Absorption of the write wavelength in the paged bR cells (converted to O) distinguishes them from the paged Q cells. Differential reading can be employed, to distinguish partly converted cells from one another. That is, the memory can operate using; [95% bR+5% Q] to represent a "0" and [90% bR+10% Q] to represent a "1". This approach avoids the need for unrealistically high photon fluxes, permits a much wider temperature range of operation, and allows much lower laser fluxes for both write and clear operations. The use of these molecular concentrations to define the bit states reduces the signal-to-noise ratio of the read process. However, this can be adequately compensated for by the use of two error-correcting bits, to achieve single bit error correction and double bit error detection. Different conversion percentages can be used, depending on the criteria for the overall proposed implementation. Also, chemically modified or genetically engineered proteins can be used in place of the native bacteriorhodopsin to enhance the properties of the memory system.

Bacteriorhodopsin (MW≅26,000) is the light-harvesting protein in the purple membrane of a micro-organism formally known as *Halobacterium salinarium* and commonly called *Halobacterium halobium*. The bacterium grows in salt marshes where the concentration of salt is roughly six times higher than that found in sea water. The purple membrane is grown by the bacterium when the concentration of oxygen becomes too low to sustain respiration. The protein, upon the absorption of light, pumps a proton across the membrane generating a chemical and osmotic potential that serves as an alternative source of energy. The fact that the protein must survive in the harsh environment of a salt marsh, where the temperatures can exceed 65° C. for extended periods of time, requires a robust protein that is resistant to thermal and photochemical damage. Recent experiments indicate that the protein can withstand temperatures as high as 140° C. (Y. Shen, C. R. Safinya, K. S. Liang, A. F. Ruppert, and K. J. Rothschild, 366 *Nature* 48–50 (1993)). However, under most conditions, denaturation occurs at about 80° C. The cyclicity of the protein, that is, the number of times it can be photochemically cycled, exceeds one million, which is a value considerably higher than most synthetic photochromic materials. Thus, the common perception that biological materials are too frail to be used in devices of this type does not apply to bacteriorhodopsin.

The light absorbing chromophore of bacteriorhodopsin is all-trans retinal (vitamin A aldehyde). The chromophore is bound to the protein via a protonated linkage to a lysine residue attached to the protein backbone. The protein bound chromophore carries a positive charge, which interacts electrostatically with charged amino acids in the protein binding site. These interactions impart photochemical properties to the chromophore that differ significantly from those observed in the chromophore when in solution. Upon the absorption of light, a rotation occurs around the $C_{13}=C_{14}$ double bond to generate a 13-cis geometry. This process is called a photoisomerization, and in bacteriorhodopsin it is complete in less than one picosecond. The reason for this unusually high speed is due to a barrierless excited state potential surface. In this regard, bacteriorhodopsin is a photochemical analog of a high-electron mobility transistor (HEMT) device. The isomefization of the protonated chromophore induces a shift in positive charge perpendicular to the membrane sheets containing the protein and generates a photoelectric signal which has a rise-time of less than five picoseconds.

When the protein absorbs fight in the native organism, it undergoes a complex photocycle that generates intermediates with absorption maxima spanning the entire visible region of the spectrum. The branched-photocycle volumetric memory described here operates at ambient temperature (15°–40° C.) and utilizes the following reaction sequences to write data:

(scheme 1)

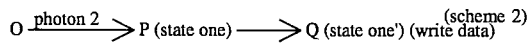

(scheme 2)

The quantum efficiency of the primary photochemical event associated with the page selection process is quite high (0.65). This is important in terms of activating an entire page efficiently. The quantum efficiency of the data write process is much lower (0.001 to 0.02), which has both advantages and disadvantages. The advantage is that multiple read operations can be carried out without disturbing the data. The disadvantage is that longer irradiation times (1 to 4 msec) are required to generate adequate photochemical conversion. The latter problem, however, is circumvented by carrying out as many as 106 write operations simultaneously. Note that photons 1 and 2 are not absorbed simultaneously, and thus this memory operates by a sequential one-photon process, not a simultaneous two-photon process. By activating a page (via photon 1) and writing the data to that page (via photon 2) by the use of orthogonal light beams, data can be accessed in three dimensions. The description of a preferred embodiment that follows will provide a detailed analysis of the volumetric considerations of the write/read/erase procedures.

The lifetime of the Q state is extremely long, and various mutants can be formed, e.g., involving aspartic acid 85 and 96, which can have a lifetime in the Q state of many years. Also if the aspartic acid 85 is replaced by a nonpolar amino acid such as asparagine, the formation of a stable M species is prevented, and the primary photocycle rapidly forms the O intermediate (or another intermediate with properties similar to the O intermediate). Also, by using polymer matrix techniques, as generally discussed in U.S. Pat. No. 5,253.198, volumetric memory media can be prepared with optimal properties.

The techniques and equipment described in detail below concentrate on the optical protocols for use in branched-photocycle volumetric memories employing the native protein, but these same principles can be extended to other possible media.

The above and other objects, features and advantages of the present invention will become apparent from the ensuing description of a preferred embodiment which should be considered in connection with the accompanying Drawing figures.

BRIEF DESCRIPTION OF THE DRAWING

FIG. 6 is a schematic diagram of the parallel write and read sequences associated with a branched-photocycle volumetric memory based on bacteriorhodopsin.

FIG. 7 is a chart showing relative laser-on times and laser-off times as a function of temperature.

DETAILED DESCRIPTION OF A PREFERRED EMBODIMENT

Figure 1:
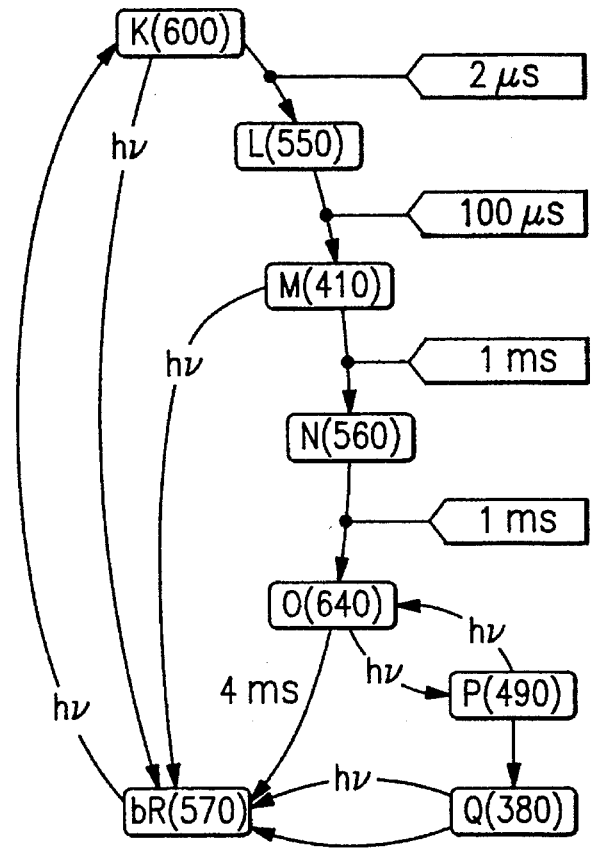
FIG. 1 is a simplified model of the light-adapted bacteriorhodopsin photocycle.

With reference to the Drawing, FIG. 1 is a model or diagram of the primary photocycle of bacteriorhodopsin. The key photochemical transformations relevant to device applications according to this invention can be considered as moving generally clockwise around the diagram. The thermal reactions that are responsible for reforming the resting bR state are shown, and the time values indicated are first-order relaxation times at moderate temperature (30° C.). The center wavelengths of the absorption bands (in nm) are indicated for each species. Starting with the bacteriorhodopsin molecule in the ground or resting state bR, illumination at a paging wavelength, e.g. 570–600 nm, elevates the molecule to an excited state K, and this decays through a number of intermediate or metastable states L, M, N, and O and then returns to the ground or resting state bR. A time of about 2 milliseconds is required to reach the O state, which has a nominal lifetime of about 4 milliseconds. This photocycle involves the all-trans and 13-cis species. If light of a write wavelength, e.g. 680 nm, is incident on the O species of the bacteriorhodopsin molecule, a stable branched intermediate 9-cis species is created, here identified as P. This photoreaction has a rather low quantum efficiency, which has advantages in conducting a read operation. After a further interval, not relevant in this implementation, a reaction occurs thermally converting the P species to a long-lived Q species. Both the P and Q species represent the binary state "1", with the ground or resting state bR representing the binary state "0". For reasons of simplicity, not all intermediates or metastable states are shown here. For instance the M species actually consists of an $M_1$ species and an $M_2$ species, which have virtually identical absorption spectra.

Figure 2:
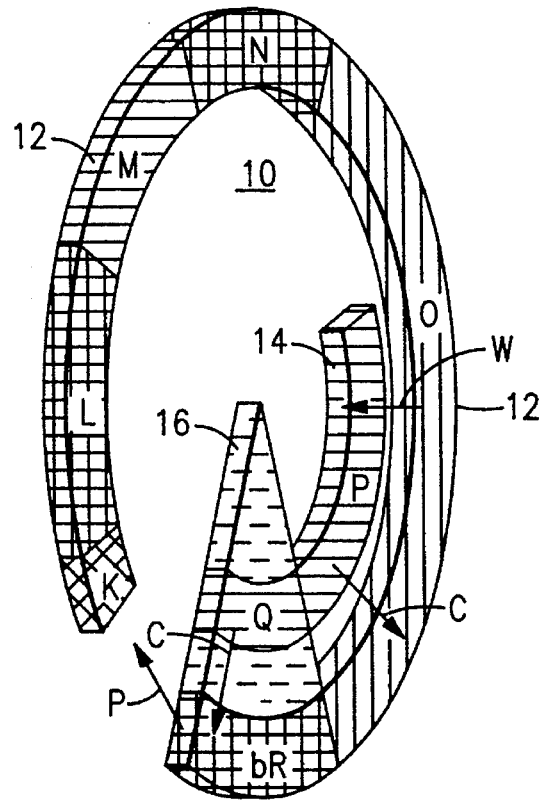
FIG. 2 is a symbol used to represent the branched photocycle, here showing the branch that leads to the P and Q photostates.

FIG. 2 (graphic symbol 10) represents the bacteriorhodopsin photocycle. The symbol 10 has an outer circle 12 that represents the main photo-species path, going clockwise, from the bR species to K and then to L, M, N, and O, before returning to the resting bR state. The main photocycle circle 12 is hatched to indicate these species. An inner arc 14 represents the P and Q states, which are reached by activation the O species with a write or data light beam. A pie-wedge section 16 represents the stable region of the photocycle, including the ground species bR and the long-lived excited species Q. The various arrows represent the photochemical steps associated with the photocycle: Arrow P indicates the paging beam, i.e., going from bR to K to initiate the main photocycle around the outer circle 12; Arrow W indicates the data beam for writing or reading data, i.e., going from the intermediate species O to P, and thence to Q; and the arrow C indicates the light beam associated with a clear process, i.e. returning the P and Q species back to the resting bR species. For clarity, the symbol 10 is shown as having the thermal reactions proceed in a clockwise direction.

Figure 3:
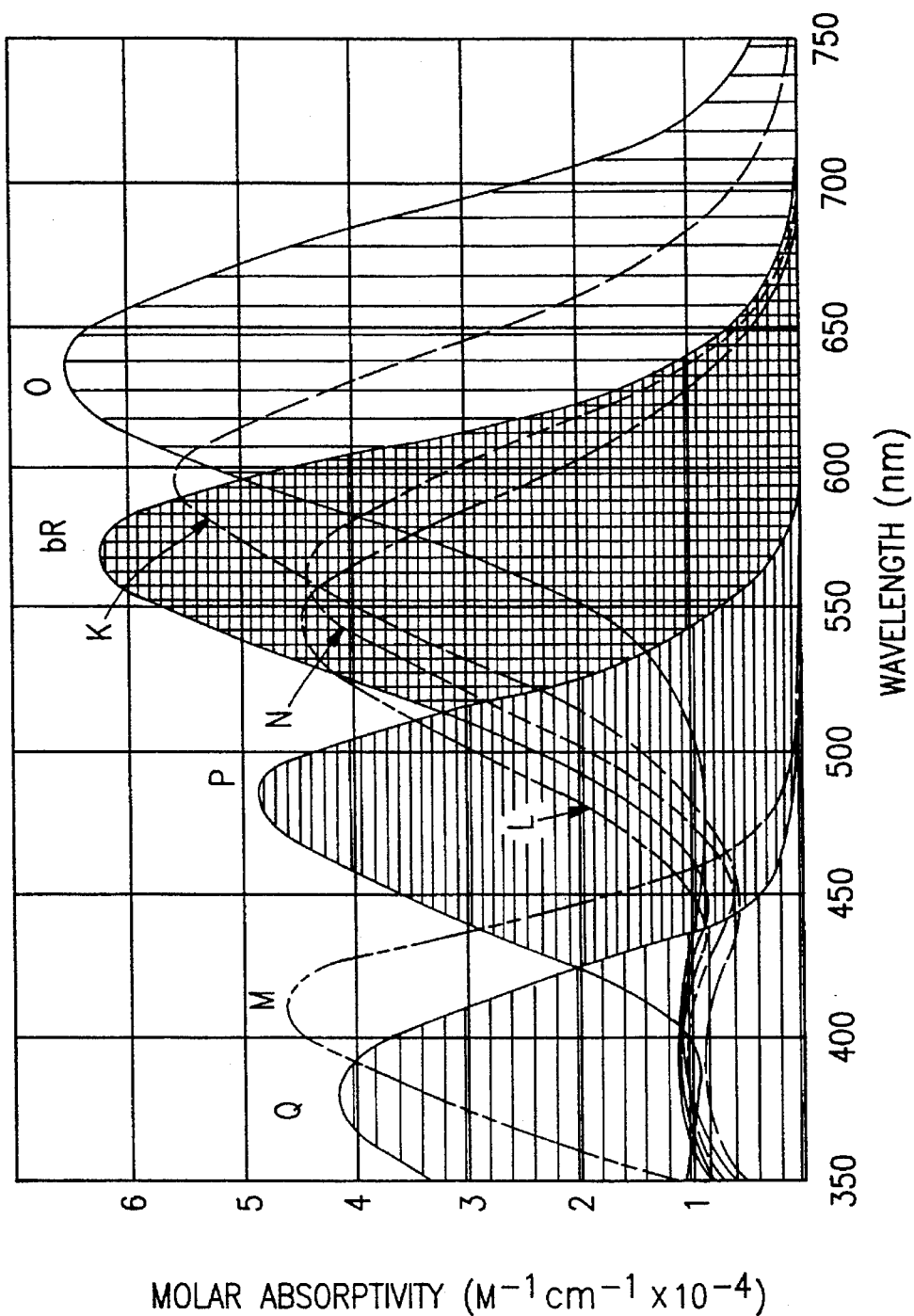
FIG. 3 is a graph of absorption spectra for the various species of bacteriorhodopsin.

Absorption spectra for the various species are shown in FIG. 3, with bR having an absorption peak at about 570 nm and Q having a peak at about 680 nm. The branched P and Q species have absorption peaks at much shorter wavelengths, about 480 nm and 380 nm, respectively.

Figure 4:
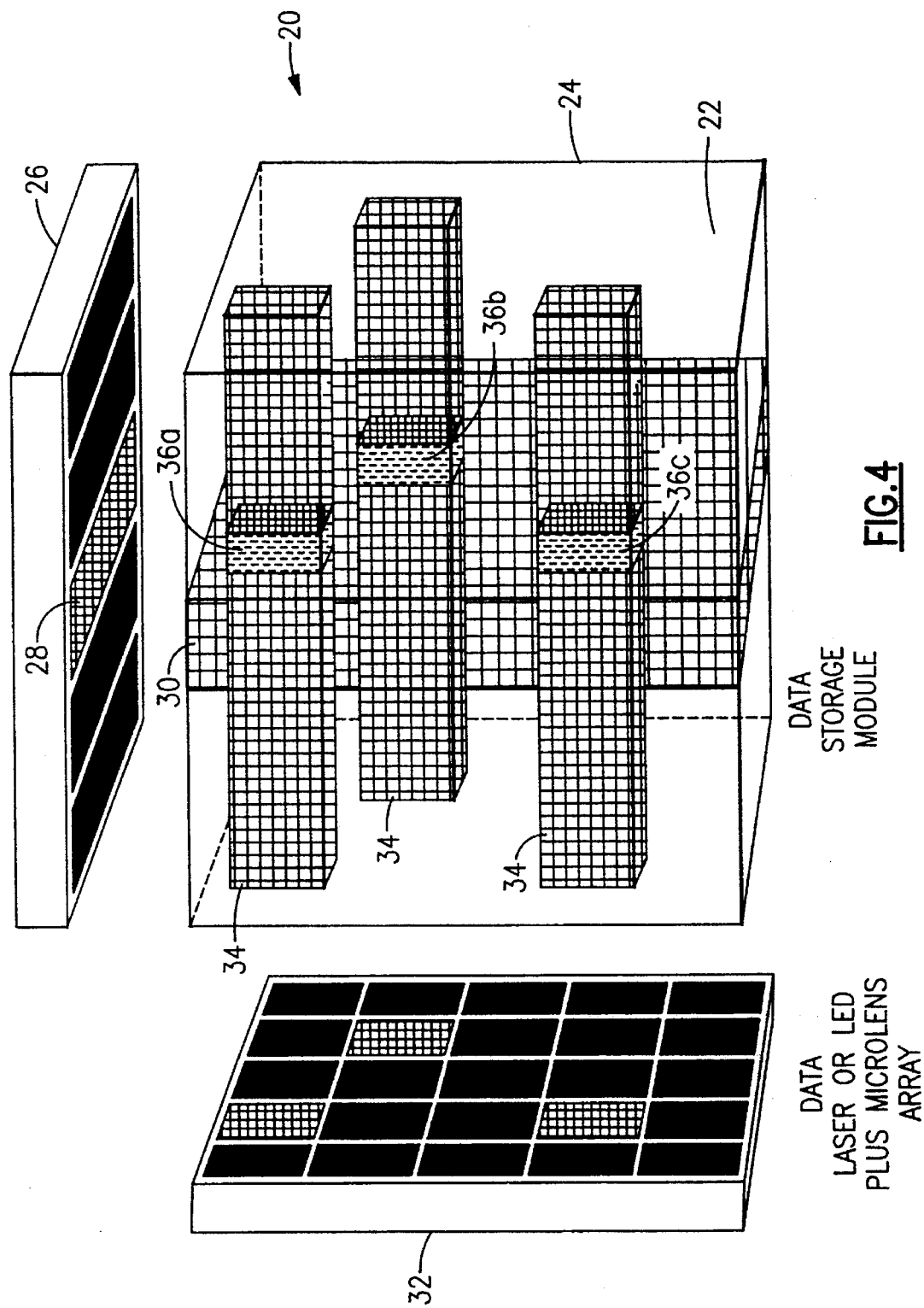
FIG. 4 is an explanatory illustration of apparatus according to one preferred embodiment of the invention, showing the parallel optical volumetric architecture for page-addressing and irradiating data cells for write and read operations.

A schematic diagram of the parallel optical architecture that is used to write information according to an embodiment of this invention is shown in FIG. 4. Here for purposes of simplicity the memory is an array of 125 elements (5 by 5 by 5), but in a practical system each volumetric memory element would have at least 2563 elements (i.e., 16 megabits), or higher. Memories of one gigabit capacity (1K by 1K by 1K), eight gigabit capacity (2K by 2K by 2K), or higher can be achieved. The same arrangement can be used to effect a parallel read of the stored data.

In this embodiment, a data storage module 20 is in the form of a cube of a photoactive medium 22 contained in a vessel or cuvette 24. Here, the module 20 has orthogonal Cartesian axes, with an X-axis extending generally left-to-right in the Drawing, a Y-axis extending vertically, and a Z-axis extending out of the Drawing plane.

A paging laser array 26 comprises five lasers or other light emitting elements 28, each oriented in a respective Y-Z (vertical) plane. Each element 28 is narrowly focussed to illuminate a respective sheet or page 30 of the medium with a paging wavelength. Where the medium includes bacteriorhodopsin, the elements 28 generate light at a paging wavelength of about 570 nm to 600 nm to illuminate only the respective page 30, but not any adjacent pages or sheets.

A data laser array 32 is formed of a plurality of lasers or, alternatively, a plurality of LEDs and microlenses, to emit light at a data wavelength of about 680 nm. In this illustration three of these twenty-five lasers are actuated, generating narrow data beams 34 parallel to the X-axis, and orthogonal to the planes of the pages 30. The beams 34 intersect at the pages 30 to define twenty-five respective data cells. Here, three beams 34 have been actuated which intersect the paging beam at respective data cells 36a, 36b, and 36c.

In the branched photocycle process, the paging beam raises the photoactive medium 22 from the ground or resting state bR to the O intermediate (metastable) species. The data beams 34 then raise the O intermediate species to the branched P species, which changes to a stable Q species. The data beams 34 at 680 nm do not interact with the bR species in the other pages 30 that have not been paged by the paging array 26, Here shading represents actuated light beams, regardless of wavelength. The cells 36a–36c where writing of a "1" is taking place are indicated by a double hatching.

Figure 5:
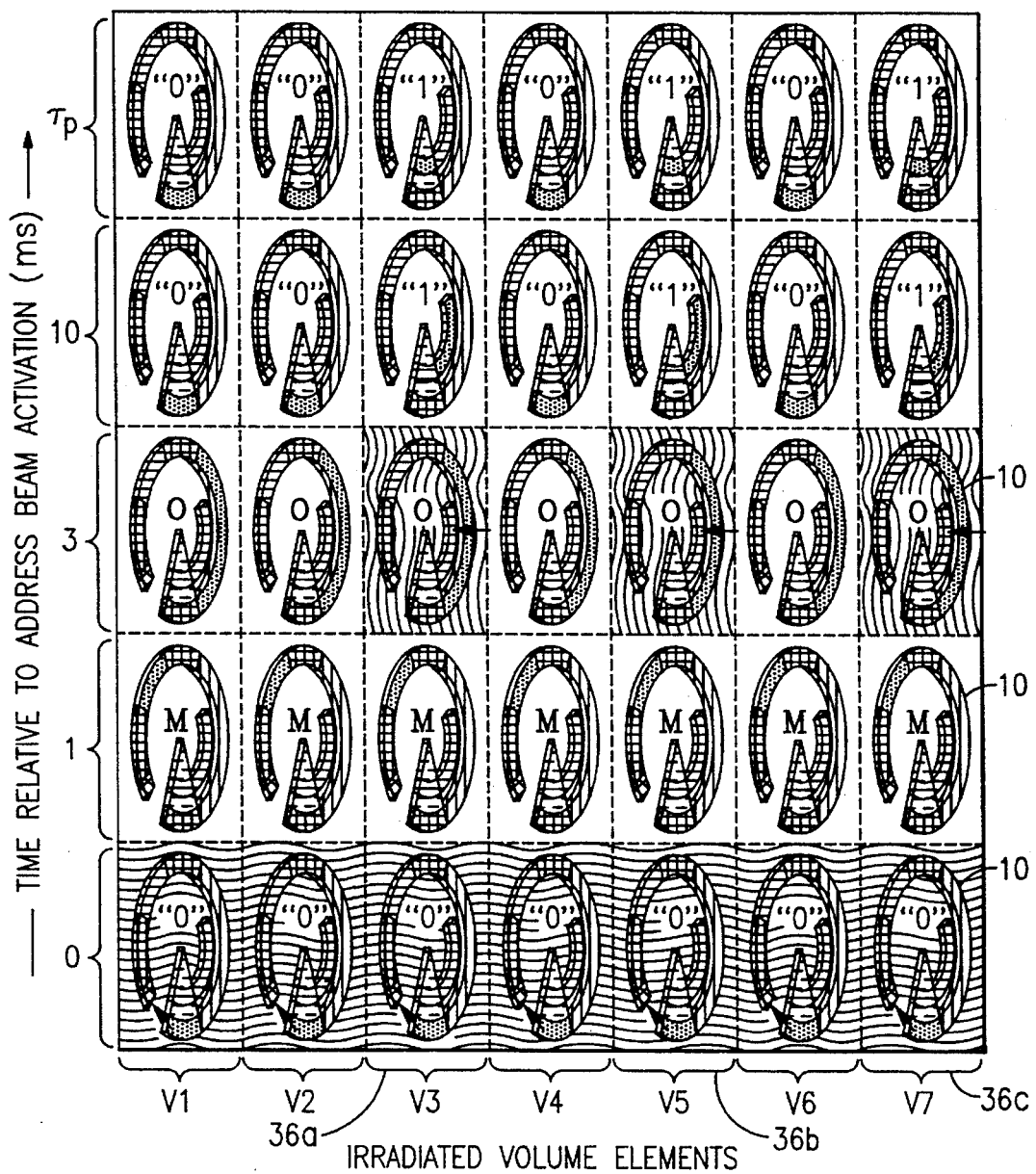
FIG. 5 is a chart for explaining the write sequence associated with branched-photocycle volumetric ,data storage based on light-adapted bacteriorhodopsin.

A write operation in this embodiment can be explained with further reference to FIG. 5. Here seven of the twenty-five irradiated volume elements or cells in the page 30 are shown as volumes V1 to V7, the remaining volumes being omitted from this view. The cells 36a, 36b, and 36c are represented by volumes V3, V5, and V7. The volumes V1 to V7 at progressive time intervals are shown above the initial row. Note that the symbol 10 that represents the bacteriorhodopsin photocycle is in each volume or cell. Wavy lines indicate light actuation. The vertical axis charts time relative to the firing of the paging element 28. The memory vessel or cuvette 24 is considered at ambient temperature (20° C. to 30° C.).

Initially, all of the memory cells 36 are in the resting, bR state, representing the "0" binary state. After about one millisecond, the photocycle 10 of the protein molecules within the activated page 30 reaches the blue-shifted M intermediate. About two milliseconds thereafter the O intermediate reaches maximum concentration, and the data array 32 is actuated to select the volume elements V3, V5, and V7. This photochemically converts the O intermediate to the P state (as indicated by the small arrows). As a practical matter a laser intensity of 6–40 Watts/cm$^2$ is used, depending upon the extent of conversion desired, operating temperature, and other factors relevant to overall implementation. In practice total conversion from O to P is not possible, regardless of beam intensity. However, the memory 20 can operate on a low percentage conversion of O to P, relying on a differential read process to be discussed later.

After a total of about 10 msec, the volume elements V1, V2, V4, and V6, not selected by the data array 32, return to the ground or resting state bR, while those volumes V3, V5, V7 selected remain in the P state. After a period $\tau_p$ on the order of minutes, depending on the temperature and polymer matrix, the P state decays to form the Q state, which is stable for periods on the order of months to years, again depending on temperature and makeup of the polymer matrix.

In this example, the bR species is assigned a binary state "0" while the P and Q species are assigned the binary state "1", as illustrated in the top row of FIG. 5. This is simply a matter of convenience, and the opposite assignment could easily be made, if desired.

The entire write process is accomplished in a period of about ten milliseconds, i.e., the time required for the photocycle to return to the resting state bR. If a 1024 by 1024 data array is used, then 1,048,576 bits, or 10.5 KB (kilobytes) can be written within each 10 ms cycle. Here each byte is considered to be eight data bits and two error-correction bits. This represents an overall throughput of 10 MB/sec, which is comparable to semiconductor memory. Higher rates are possible by operating two, four, or more data cubes simultaneously.

A parallel read process can be carded out in a fashion similar to the write process described above. The read process takes advantage of the fact that wavelengths in the vicinity of 680 nm are absorbed by only two intermediates, the relatively short-lived photoproduct K and the relatively long-lived intermediate O. Parallel reading can be carried out by either a differential absorption process or by a sequential photovoltaic process. The differential absorption read process will be described with reference to FIG. 6, which is a schematic view of the parallel write and read processes associated with a branched-photocycle volumetric memory based on bacteriorhodopsin. In FIG. 6 the write sequence is depicted on the left and the read sequence is depicted on the right, with time progressing from bottom to top.

The write process assumes that all bit cells have been cleared to zero, i.e., to bR. Three of twenty-five bits have been written onto a page 30 following the same process as described above in respect to FIGS. 4 and 5. The read cycle assumes these same data cells are set prior to a read cycle.

The same paging operation occurs in a read sequence as described above for the write sequence. That is, the paging array 26 illuminates the selected page 30 with light at about 570–600 nm. However, unlike the write sequence described before, in which selected lasers or LEDs only of the data array 30 are fired at full power, the entire array 32 is illuminated, but at a severely reduced level, e.g., 0.01% of full power. The amount of light that transits each of the cells in the cube of medium 22 is monitored by a charge injection device or CID 40, here configured in a conforming array with the same number of elements as the data array 32.

In those locations 36a, 36b, 36c where "1" bits (P and Q) have been written, the 680 nm light beam passes without significant attenuation, because the P and Q species do not absorb this wavelength. In contrast, in the remaining locations, the paging array 26 has created the O species which absorbs the 680 nm beam strongly. The differential absorptivities of the "0" and "1" bit cells can be clearly differentiated at the CID image plane and the entire page 30 is read in parallel by scanning the CID array 40.

In this embodiment, all of the remaining elements outside the one selected page 30 are either in the resting state bR associated with a zero bit "0" or the energized state P or Q associated with a one bit "1"; neither is in the K or O state, and so neither absorbs the 680 nm wavelength strongly.

Because of the low intensity of the read data beam, and because of the low quantum efficiency of the O to P reaction, the read cycle does not significantly alter the state of memory cells or elements within the selected page 30, although a small amount of photochemistry does occur. The number of read cycles can be monitored, e.g., with software or firmware. If the number of read cycles without an intervening write cycle exceeds a predetermined count, e.g., N>10,000, a refresh of the entire page is carded out. If a single-page-capacity semiconductor cache is used to store data, a refresh cycle would rarely be required.

Data laser on times and data laser off times vary as a function of temperature of the material, as indicated in the chart of FIG. 7. The nominal operating temperature is favorably maintained between about 15° C. and 40° C., as shown. Optimum signal-to-noise performance is obtained at 30° C., but adequate performance is obtained within the range of 20° C. to 40° C.

In this embodiment, the CID detector array 40 is preferred for its differential responsivity within the paged region. Because the absorptivity of the metastable O state is more than 100 times greater than the remainder of the volume elements combined, a weak read data laser beam can be employed to generate a large differential signal. A CID is preferred to a CCD (charge-coupled device) because it is less prone to cross talk and "blooming", which can diminish the differential signal. A 1024 by 1024 CID array is employed as the detector array 40, so the read rate that is achieved is identical to the write rate.

An alternative approach to the parallel read process involves monitoring the differential photovoltage that is induced when the O species bacteriorhodopsin absorbs a photon of light. Upon excitation, the O species undergoes a significant change in dipole moment (approximately 14 Debye) due to a shift of electron density in the π-electron system of the protonated retinyl chromophore. This charge shift induces a photovoltaic response that is extremely rapid and which can be monitored using an oriented protein sample enclosed within transparent indium-tin-oxide electrodes. The protocols for preparing such memory cubes have been well established (See Birge et al. U.S. Pat. No. 5,253,198). The parallel photovoltaic read operation is accomplished by carrying out the paging process shown in FIG. 6, followed by a sequential activation of the data array elements in a sequence of three nanosecond pulses. The photovoltage is monitored during this sequence and when the O species is present, a photovoltage is observed, but when the P or Q species is present, no absorption occurs and therefore no photovoltage is observed. Because each bit can be analyzed in 3 to 4 nanoseconds, the scanning of an entire page 30 of 1024 by 1024 bit cells requires about 3 to 4 milliseconds. This serial photovoltaic read cycle can therefore be accomplished during the cycle time of the bacteriorhodopsin photocycle.

A parallel clear-to-zero process can be carried out optically, preferably using light at a blue wavelength. The parallel write process that was described above assumes that all of the bit cells within the paged volume are initially set into the binary "0" state, i.e., bR. A page clear is accomplished by using a blue laser beam (λ=420 nm) to convert photochemically both the P and Q species back to bR within the paged volume. This process can be accomplished in parallel with synchronous activation of blue lasers during either a read process or a write process on another page of the memory 20. Furthermore, more than one page at a time can be cleared. If desired, the entire memory 20 can be cleared simultaneously by bathing the entire cuvette 24 in incoherent blue light. This type of global erase approach is similar to that used in ambient-temperature thin-film optical cache memory devices based on bacteriorhodopsin (See Birge et al. U.S. Pat. No. 5,228,001). Implementation of the memory clear depends upon the total memory architecture. In some cases, only one cuvette is used to store information, and it is necessary to clear only selected regions within the cube. In other cases, two or more memory cubes are available, and one entire cube can be cleared while another cube is used to store active data. The choice of the most cost-effective architecture depends on the commercial availability, cost, and capabilities of elements such as blue semiconductor lasers.

The memory 20 is somewhat temperature dependant, and performance can be optimized by selection of operating temperature. The previous discussion has assumed that the memory cuvette 24 is at ambient temperature (20° C. to 30° C.). However, the memory 20 can operate over a temperature range of 10° C. to 45° C., provided the timing of the paging and data lasers are adjusted accordingly. Based on the experimental data, the optimal data beam on and data beam off times can be determined. The results are shown in the graph of FIG. 7, and can be described to adequate accuracy by using the following equations:

$$\Delta t \ (data\ beam\ on) = 21.8 \ ms \ T_C(°C.)^{-0.7} \ (10° \ C. < T_C < 45° \ C.) \quad (1)$$

$$\Delta t \ (data\ beam\ off) = 61.1 \ ms \ T_C(°C.)^{-0.7} \ (10° \ C. < T_C < 45° \ C.) \quad (2)$$

where $\Delta t$ is the time in milliseconds relative to address beam activation and $T_C$ is the temperature of the memory cuvette 24 in degrees Celsius. The above relationships are approximate and are limited to solutions near pH=7 or well humidified polymer environments. Regardless of environment, however, simple equations such as the above can be calculated from an analysis of the relative signal strength observed as a function of $T_C$ and $\Delta t$. The data beam on time is equal to the time at which the signal reaches half its minimum value. The data beam off time is equal to the time at which the signal returns to its half-minimum value. These times are appropriate for both the read and write beam timings, but as noted above, the read process is carried out using a very low light level. If a memory is designed without temperature control for the memory cube, a probe should be used to monitor the temperature of the data cuvette 24 so that the controller circuitry can adjust the $\Delta t$ values to optimize performance. If temperature control is provided, the memory 20 reaches its maximum performance at approximately 30° C. Examination of Equations (1) and (2) indicates that the memory can operate more rapidly at higher temperatures, but that temperatures above 40° C. should be avoided as elevated temperatures decrease the cyclicity of the protein.

The signal-to-noise ratio of the read process improves with increasing temperature in large part because the amount of the O intermediate that is generated increases with temperature. This observation follows from experimental data, and can be explained by reference to detailed kinetic analyses of the photocycle as described in Varo, G. and J. K. Lanyi, 30 *Biochem.* 5016–5022 and 7165–7171 (1991).

Practical realizations of the memory devices of this invention arise from various architectural considerations.

In the embodiments described above, the "0" state has been assigned to pure bR material, and the "1" state has been assigned to a mixture consisting essentially of P and Q. However, this example was offered only to facilitate a general understanding of the key components of the optical architecture and the molecular processes. While this approach is possible in principle, in practice it would require unrealistically high photon fluxes. In a realistic embodiment, the memory 20 operates with maximal efficiency by assigning a "0" state to a mixture of [95% bR+5% P+Q] and a "1" state to [90% bR+10% P+Q]. Thus, only a 5% photochemical conversion is required to store or erase data, which yields a larger temperature range of operation, and allows for lower laser fluxes for both write and clear operations. The use of the above molecular concentrations to define the bit states reduces the signal-to-noise ratio of the read process, but the use of two error-correcting bits compensates adequately by providing single-bit error correction and double-bit error detection. Different conversion percentages can be employed depending upon the proposed implementation. Thus, the above recipe can be modified to suit the overall system requirements. As noted above, chemically modified or genetically engineered proteins can be used in place of the native protein to enhance the properties of the memory 20. A number of possibilities are currently under study, including $ASP_{85} \rightarrow ARG$ and $ASP_{96} \rightarrow ARG$ mutants, and an analog protein containing a 13-desmethyl 4-keto chromophore.

Although the above discussion has been limited to fully parallel architectures with no moving parts, alternative approaches could be employed. For example, paging can be accomplished using an actuator to move the cube or cuvette, and the two-dimensional diode arrays can be replaced with linear diode arrays. This approach diminishes the cost of the device, but at the expense of speed when a page fault is encountered, requiring mechanical movement of the memory cuvette 24 or of the paging device.

Figure 8:
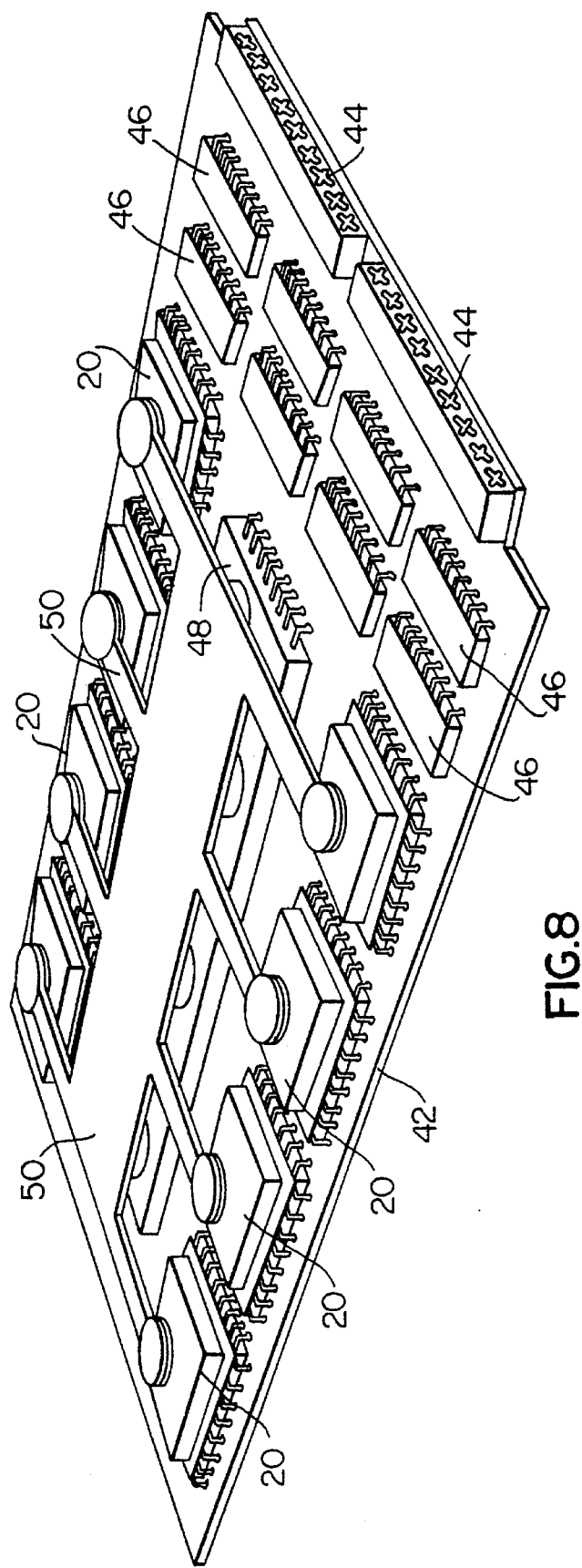
FIG. 8 is one possible design for a volumetric memory board that incorporates the principles of the present invention.

A volumetric memory card that incorporates several memory devices 20 according to this invention is shown in FIG. 8. This card is arranged on a plug-in printed circuit board 42 having standard female end connectors 44. Here there are eight memory units 20 and a bank of eight buffer-drivers 46. Paging control and laser power sources 48 are connected by an overhead bus 50 to the eight volumetric memories 20. This memory card has a storage capacity of approximately 3 GBytes of data, assuming two error correcting bits per eight-bit byte, and would have access times comparable to slow semiconductor memory within each 3 MByte page. Access time is at least as fast as magnetic disc memory when a page fault occurs. This memory card is not susceptible to stray magnetic fields.

While this invention has been described in terms of a preferred embodiment and alternatives thereto, the invention is certainly not limited to such embodiments. Rather, many modifications and variations will present themselves to persons skilled in the art without departing from the scope and spirit of this invention, as defined in the appended claims.

What is claimed is:

1. Sequential one-photon branched photocycle volumetric optical memory device comprising:

a volume of a photooptical material that has a stable resting state and a series of intermediate states including a metastable stable state which can be photochemically converted to a branched state; said volume being configured as a succession of planar pages each page being configured as an orthogonal array of data cells;

paging means for illuminating a selected page of said volume but not illuminating the remaining pages of said volume at a first wavelength to elevate the photooptical material within said selected page from said resting state to said metastable state;

data selection array operative after said paging means for illuminating one or more selected data cells within said selected page but not non-selected cells, at a second wavelength to convert said material within selected cells from said metastable state to said stable branched state, the material in said non-selected cells returning to said resting state; with said stable branched state representing one binary condition and said resting state representing a complementary binary condition; and optical read means for optically selecting a page of the volume and reading the binary condition of each of the data cells of the so-selected page of said volume.

2. Branched photocycle volumetric optical memory device according to claim 1 wherein said optical read means includes means for actuating said paging means to illuminate said selected page at a suitable wavelength to elevate the material of the selected page to said metastable state and means actuating said data selection array subsequently and at said second wavelength in a direction orthogonal to said selected page; a photosensor array with photosensor cells positioned to correspond to the data cells of said selected page and aligned to receive light of said second wavelength that passes through said selected page; and differential means for generating for each photosensor cell a differential signal representing the absorptivity of the corresponding data cell for the light at said second wavelength.

3. Branched photocycle volumetric optical memory device according to claim 1 wherein said optical read means includes means for actuating said paging means to illuminate said selected page; means for subsequently actuating said data selection array sequentially; and means for measuring a photovoltage of said volume in synchronism with the sequential actuation of said data selection array.

4. Branched photocycle volumetric optical memory device according to claim 1 further comprising optical clear means applying a light of a third predetermined wavelength to a selected page of said volume to convert said material from said stable excited state back to said ground state.

5. Branched photocycle volumetric optical memory device according to claim 2 wherein said data selection array is operated at a first predetermined level to conduct a write operation, and is actuated at a second predetermined level significantly lower than said first level to conduct a read operation.

6. Branched photocycle volumetric optical memory device according to claim 1 wherein said photooptical material includes a quantity of bacteriorhodopsin.

7. Branched photocycle volumetric optical memory device according to claim 6 wherein said first predetermined wavelength is substantially 600 nm and said second wavelength is substantially 680 nm.

8. Sequential one-photon process for optically recording data in a branched photocycle optical memory device wherein the device comprises a volume of a photooptical material that has a stable resting state and a series of intermediate states including a stable branched state and a metastable state; said volume being configured as a succession of planar pages each page being configured as an orthogonal array of data cells; the process comprising:

illuminating a selected page of said volume but not illuminating the remaining pages of said volume at a first wavelength to elevate the photooptical material within said selected page from said resting state to said metastable state; and subsequently illuminating one or more selected data cells within said selected page, but not non-selected cells, at a second wavelength to convert said material within said selected cells from said metastable state to said stable branched state, the material in said non-selected cells returning to said resting state; with said stable branched state representing one binary condition and said resting state representing a complementary binary condition.

9. The process of claim 8 further comprising optically reading the data recorded in said optical memory device, including the steps of illuminating said selected page at said first wavelength;

subsequently illuminating the data cells of said selected page in parallel with light at said second wavelength; and detecting differential absorption of the light of said second wavelength passing through said data cells.

10. The process of claim 8 further comprising optically reading the data recorded in said optical memory device, including the steps of illuminating said selected page at said first wavelength;

subsequently illuminating the data cells of said selected page in sequence with light at said second wavelength; and measuring a photovoltage of said volume in synchronism with the sequential illumination of said data cells.

* * * * *